(12) United States Patent
Albrecht et al.

(10) Patent No.: US 7,653,111 B2
(45) Date of Patent: *Jan. 26, 2010

(54) OPTICALLY PUMPED, SURFACE-EMITTING SEMICONDUCTOR LASER DEVICE AND METHOD FOR THE MANUFACTURE THEREOF

(75) Inventors: Tony Albrecht, Bad Abbach (DE); Norbert Linder, Wenzenbach (DE); Johann Luft, Wolfsegg (DE)

(73) Assignee: Osram GmbH, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/249,094

(22) Filed: Oct. 12, 2005

(65) Prior Publication Data

US 2006/0039437 A1 Feb. 23, 2006

Related U.S. Application Data

(60) Continuation of application No. 10/902,342, filed on Jul. 29, 2004, now Pat. No. 7,300,808, which is a division of application No. 09/824,086, filed on Apr. 2, 2001, now Pat. No. 6,954,479.

(30) Foreign Application Priority Data

May 30, 2000 (DE) .............. 100 26 734
Feb. 20, 2001 (DE) .............. 101 18 079

(51) Int. Cl.
*H01S 5/00* (2006.01)
(52) U.S. Cl. .............. 372/50.124; 372/50.1; 372/70; 372/71; 372/75
(58) Field of Classification Search .............. 372/70–71, 372/75, 50.1, 50.124
See application file for complete search history.

(56) References Cited

U.S. PATENT DOCUMENTS 4,380,076 A   4/1983   Bethune
4,791,646 A * 12/1988   Lindsey et al. .......... 372/44.01

(Continued)

FOREIGN PATENT DOCUMENTS

DE       1 514 507        5/1969

(Continued)

OTHER PUBLICATIONS

Japanese Abstract, 07249824, Date of Publication Sep. 26, 1995.

(Continued)

*Primary Examiner*—Minsun Harvey
*Assistant Examiner*—Joshua King
(74) *Attorney, Agent, or Firm*—Cohen Pontani Lieberman & Pavane LLP

(57) ABSTRACT

The invention is directed to an optically pumped surface-emitting semiconductor laser device having at least one radiation-generating quantum well structure and at least one pump radiation source for optically pumping the quantum well structure, whereby the pump radiation source comprises an edge-emitting semiconductor structure. The radiation-generating quantum well structure and the edge-emitting semiconductor structure are epitaxially grown on a common substrate. A very efficient and uniform optical pumping of the radiation-generating quantum well structure is advantageously possible with this monolithically produced semiconductor laser device. Methods for manufacturing inventive semiconductor laser devices are also specified.

29 Claims, 14 Drawing Sheets

U.S. PATENT DOCUMENTS

| | | | |
|---|---|---|---|
| 5,131,002 A | 7/1992 | Mooradian | |
| 5,212,701 A | 5/1993 | Choquette et al. | |
| 5,212,706 A | 5/1993 | Jain | |
| 5,231,642 A | 7/1993 | Scifres et al. | |
| 5,548,610 A | 8/1996 | Bouadma et al. | |
| 5,748,653 A * | 5/1998 | Parker et al. | 372/8 |
| 5,796,771 A | 8/1998 | DenBaars et al. | |
| 5,991,318 A | 11/1999 | Caprara et al. | |
| 6,195,381 B1 * | 2/2001 | Botez et al. | 372/96 |
| 6,285,702 B1 * | 9/2001 | Caprara et al. | 372/92 |
| 6,347,104 B1 * | 2/2002 | Dijaili et al. | 372/38.01 |
| 6,359,920 B1 * | 3/2002 | Jewell et al. | 372/46.01 |
| 6,424,669 B1 * | 7/2002 | Jiang et al. | 372/50.1 |
| 6,535,537 B1 * | 3/2003 | Kinoshita | 372/50.11 |
| 6,556,610 B1 | 4/2003 | Jiang et al. | |
| 6,559,949 B1 | 5/2003 | Numai | |
| 6,687,280 B1 | 2/2004 | Kaijita | |
| 6,954,479 B2 * | 10/2005 | Albrecht et al. | 372/50.1 |
| 2001/0030985 A1 | 10/2001 | Abeles | |
| 2002/0075935 A1 * | 6/2002 | Clayton | 372/75 |

FOREIGN PATENT DOCUMENTS

| | | |
|---|---|---|
| DE | 2 413 493 | 10/1974 |
| DE | 39 16 962 | 11/1990 |
| DE | 44 25 711 | 2/1995 |
| DE | 195 06 959 | 8/1996 |
| DE | 197 17 571 | 10/1998 |
| EP | 0892474 A1 * | 7/1998 |
| JP | 07249824 * | 9/1995 |
| JP | 8-018166 | 1/1996 |
| JP | 2000-283768 | 10/2000 |
| JP | 2001-085790 | 3/2001 |
| WO | WO 01/31756 | 5/2001 |
| WO | WO 01/33678 | 5/2001 |
| WO | WO 01/93386 A1 | 12/2001 |

OTHER PUBLICATIONS

Redwing et al., "An optically pumped GaN-AlGaN vertical cavity surface emitting laser", XP 000599607, Appl. Phys. Letter vol. 69, No. 1, pp. 1-3, Jul. 1996.

Benjamin et al., "Vertical cavity surface emitting laser with a submonolayer thick InAs active layer", XP 00273980, Applied Phys. Letters, vol. 60, No. 15, pp. 1800-1802, Apr. 1992.

Onischenko et al., "Prediction of a large optical bist ability in hybrid-cavity surface-emitting lasers", IEE Proc.-Optoelectron, vol. 146, No. 1, pp. 67-70, Feb. 1999.

Gerhold et al., "Novel Design of a Hybrid-Cavity Surface-Emitting Laser", IEEE Journal of Quantum Electronics, vol. 34, No. 3, pp. 506-511, Mar. 1998.

Grabherr et al., "Bottom-Emitting VCSEL's for High-CW Optical Output Power", IEEE Photonics Technology Letters, vol. 10, No. 8, pp. 1061-1063, Aug. 1998.

Shire et al., "Coupled In-Plane and Vertical-Cavity Laser 1 X N Routing Switches", IEEE Photonics Technology Letters, vol. 8, No. 11, pp. 1537-1539, Nov. 1996.

Shire et al., Multiple-Input Optical Control of Vertical Cavity Surface Emitting Lasers Using Intracavity-Coupled In-Plane Lasers, IEEE Photonics Technology Letters, vol. 8, No. 2, pp. 188-190, Feb. 1996.

Shire et al., "Gain controlled vertical cavity surface emitting lasers coupled with intracavity in-plane lasers", Appl. Phys. Lett. 66. pp. 1717-1719, Apr. 1995.

Mark Kuznetsov et al., "Design and Characteristics of High-Power (>0.5-WCW) Diode-Pumped Vertical-Externa-Cavity Surface-Emitting Semiconductor Lasers with Circular $TEM_{00}$ Beams", IEEE Journal of Selected Topics in Quantum Electronics, vol. 5, No. 3, pp. 561-573, May/Jun. 1999.

Search Report dated Nov. 30, 2007 issued for the corresponding European Application No. 07118145.

* cited by examiner

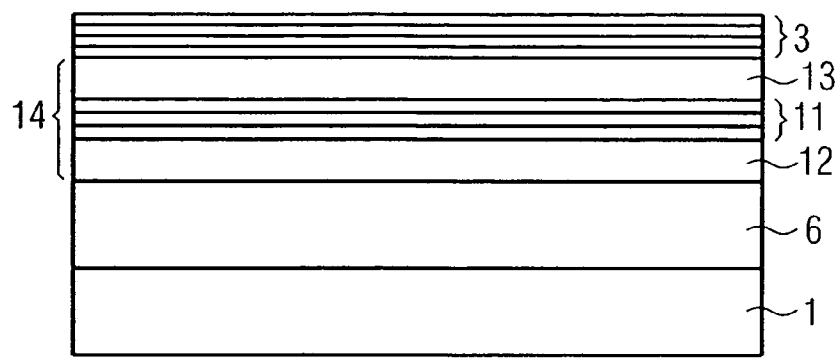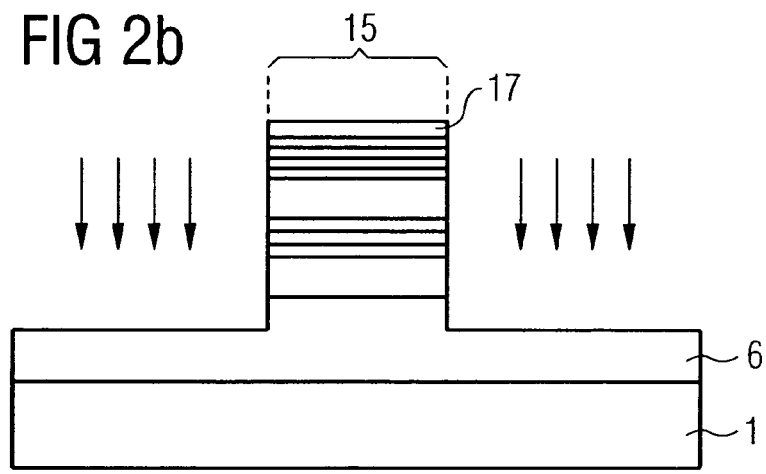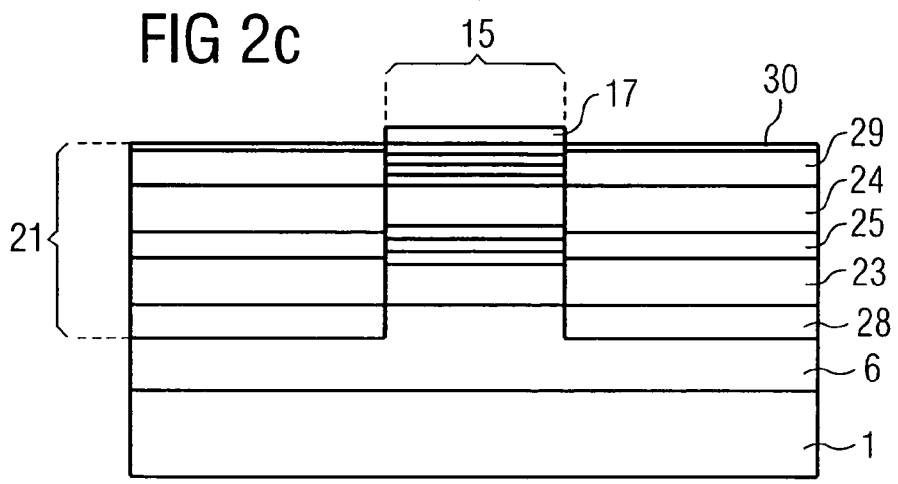

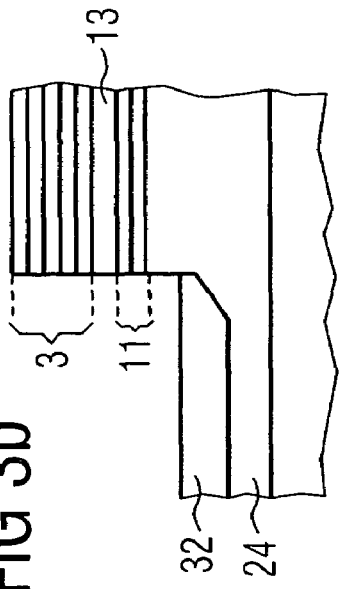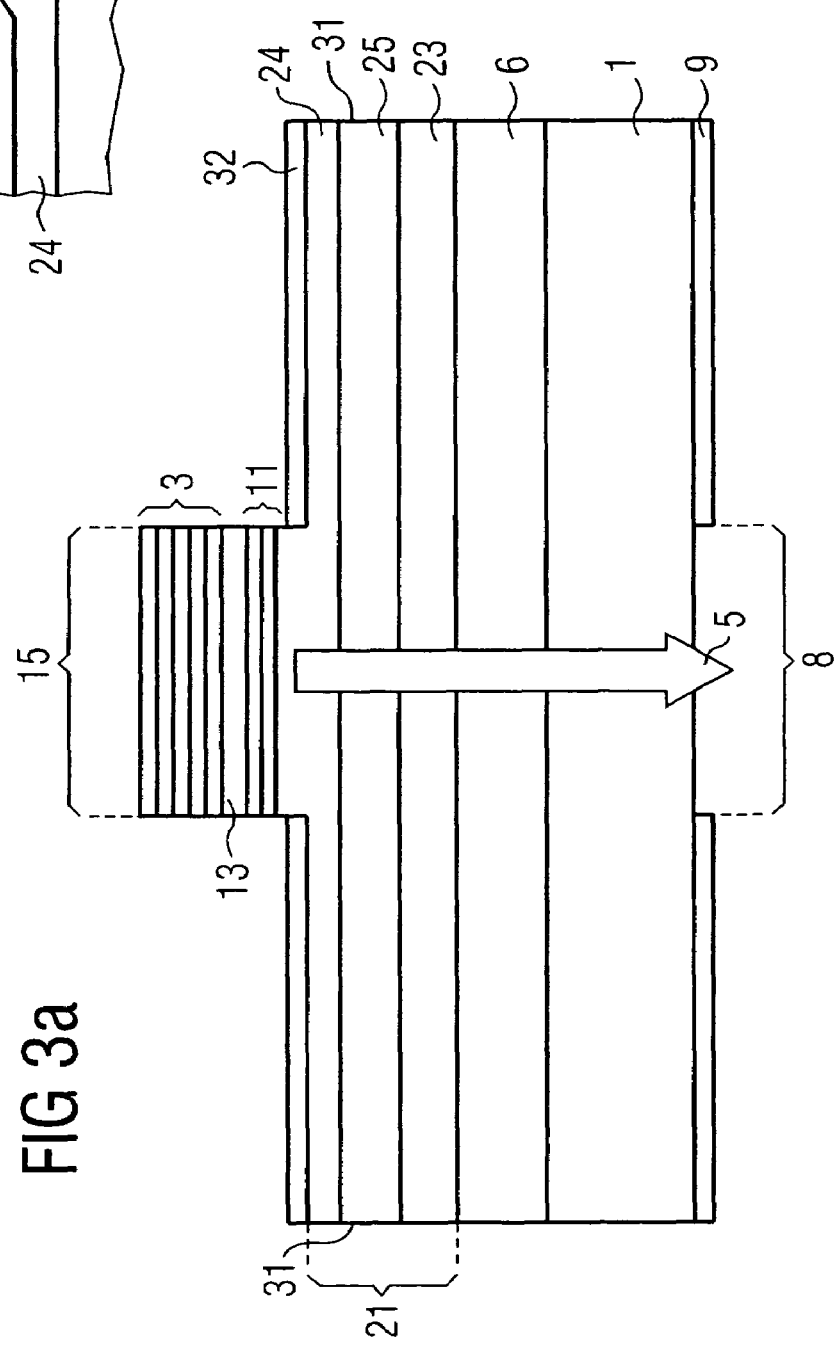

FIG 4a
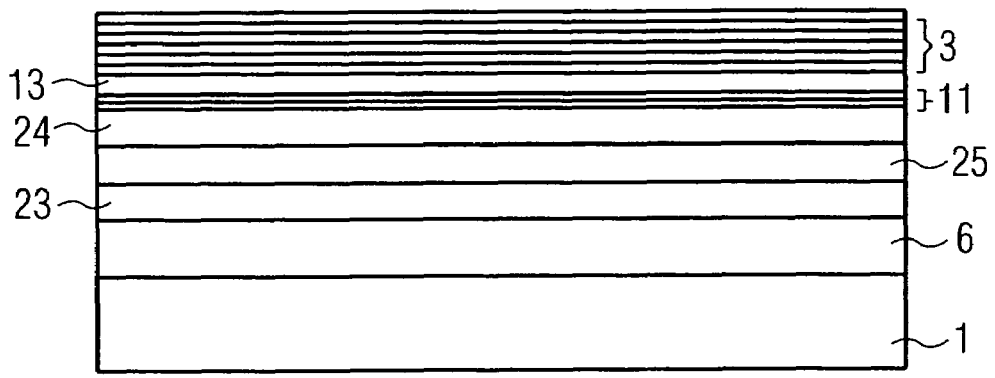
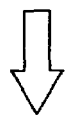
FIG 4b
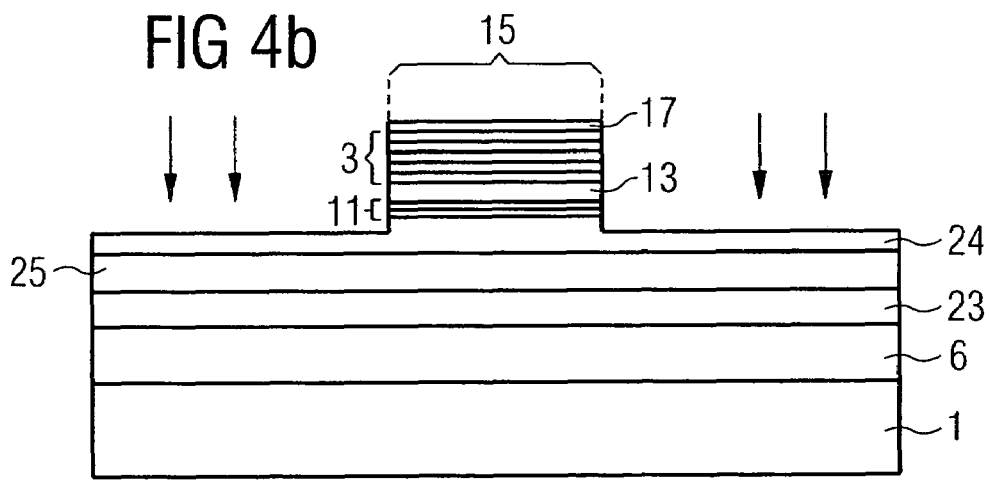
FIG 4c
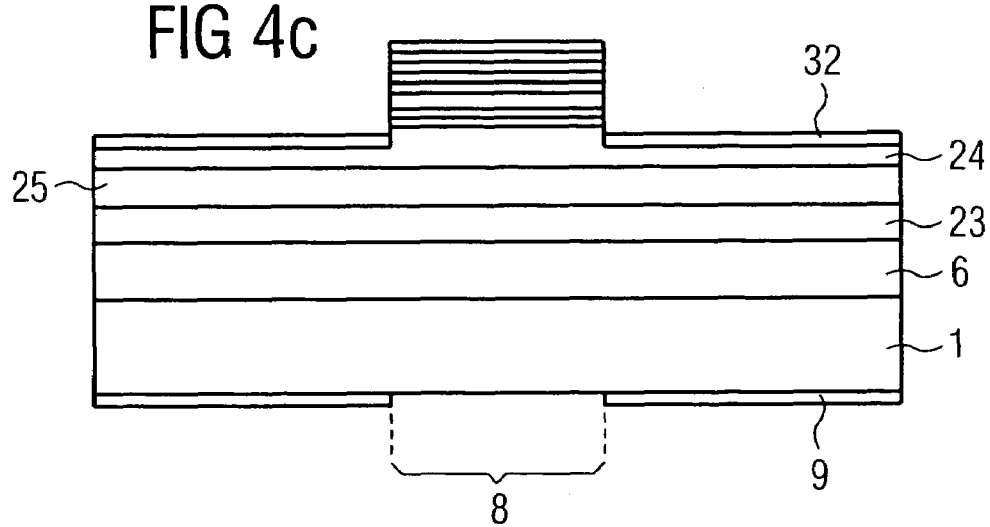

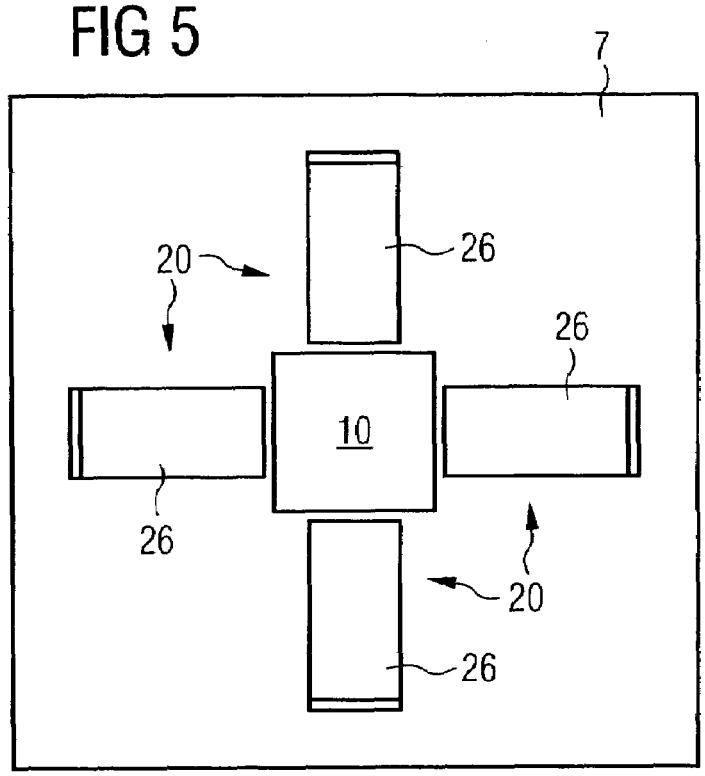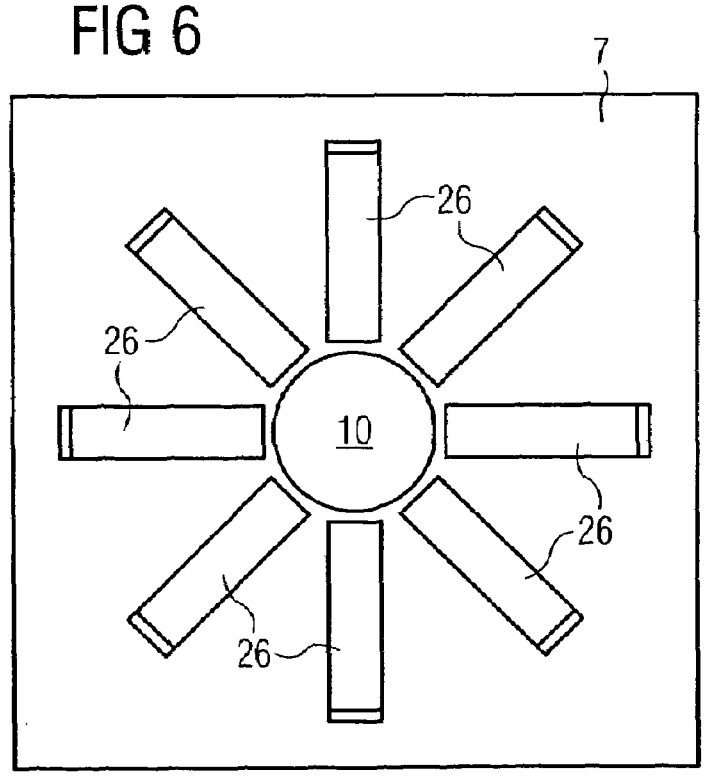

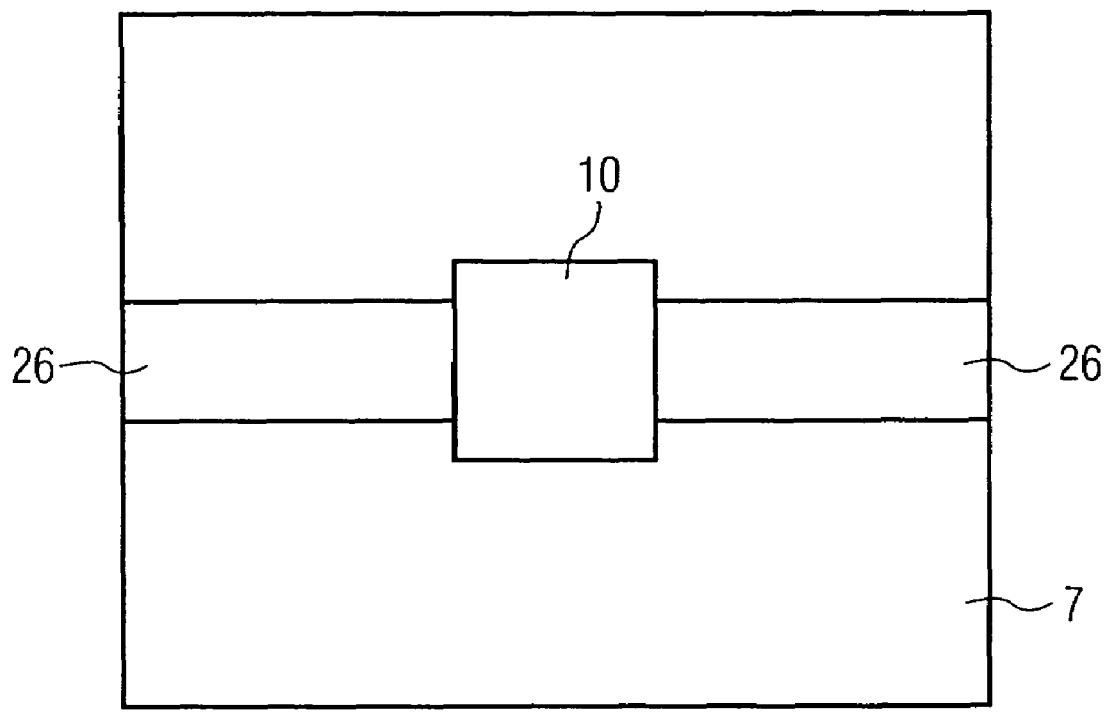

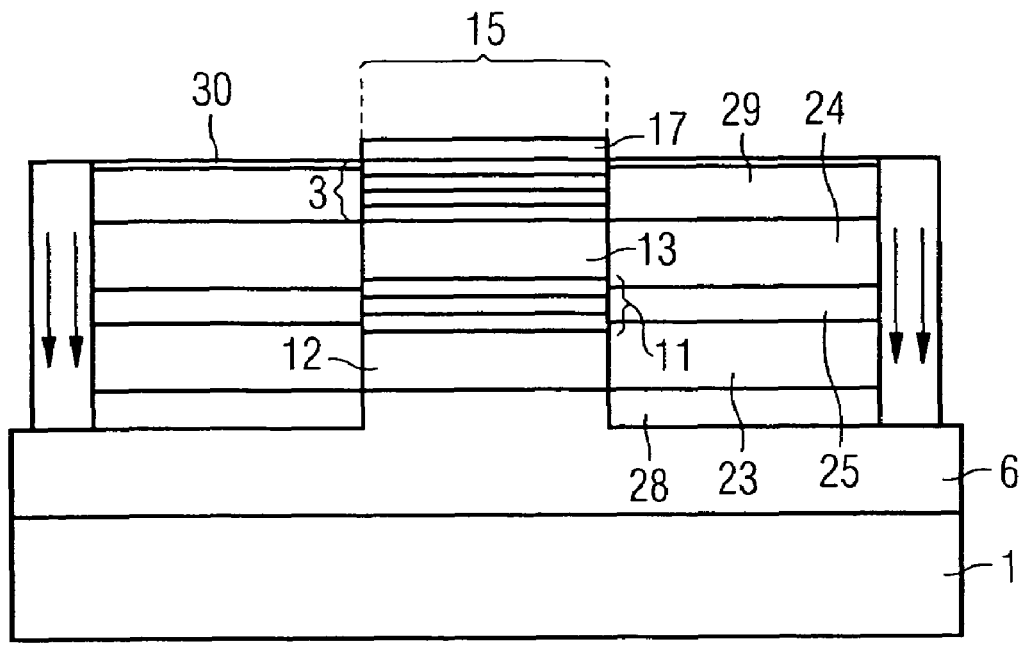
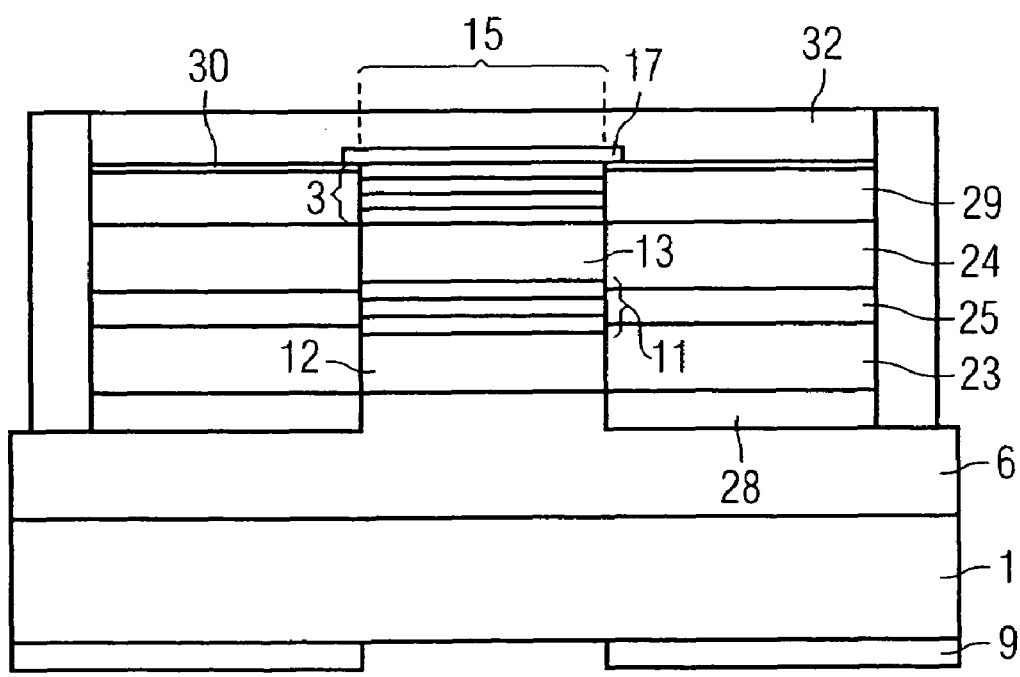

OPTICALLY PUMPED, SURFACE-EMITTING SEMICONDUCTOR LASER DEVICE AND METHOD FOR THE MANUFACTURE THEREOF

CROSS REFERENCE TO RELATED APPLICATIONS

This is a continuation of application Ser. No. 10/902,342, filed Jul. 29, 2004, now U.S. Pat. No. 7,300,808 which is a divisional of application Ser. No. 09/824,086 filed Apr. 2, 2001 now U.S. Pat. No. 6,954,479. Priority is claimed from applications filed in Germany on May 30, 2000, No. 100 26 734.3 and on Feb. 20, 2001, No. 101 18 079.4, the subject matter of which is incorporated herein by reference.

BACKGROUND OF THE INVENTION

1. Field of the Invention

The invention is directed to an optically pumped surface-emitting semiconductor laser device having at least one radiation-generating quantum well structure and at least one pump radiation source for optically pumping the quantum well structure, whereby the pump radiation source comprises an edge-emitting semiconductor structure.

2. Description of the Related Art

A semiconductor laser device of the species initially described is disclosed by U.S. Pat. No. 5,991,318. An optically pumped vertical resonator semiconductor laser having a monolithic surface-emitting semiconductor layer structure is disclosed therein. Given this known device, the optical pump radiation, whose wavelength is shorter than that of the generated laser emission, is supplied by an edge-emitting semiconductor laser diode. The edge-emitting semiconductor laser diode is externally arranged such that the pump radiation is beamed obliquely in from the front into the intensification region of the surface-emitting semiconductor layer structure.

A particular problem given this known device is comprise therein that the pump laser must be exactly positioned relative to the surface-emitting semiconductor layer structure and, additionally, requires an optical means for beam focusing in order to image the pump radiation exactly into the desired region of the surface-emitting semiconductor layer structure. These measures involve considerable technological outlay.

In addition to the losses at the optics, moreover, coupling losses also occur that reduce the overall efficiency of the system.

Another problem is comprised therein that only a few quantum wells can be excited by pump radiation due to the pumping from the front.

SUMMARY OF THE INVENTION

The object of the present invention is comprised in making available a semiconductor laser device of the species initially cited with simplified adjustment of the pump source and surface-emitting layer structure and with high output power. Further, a technically simple method for manufacturing such a device is recited.

According to the invention, the radiation-generating quantum well structure and the edge-emitting semiconductor structure are epitaxially grown on a common substrate given an optically pumped surface-emitting semiconductor laser device of the species initially cited. The layer thicknesses of the individual semiconductor layers can be very exactly set in the epitaxy, so that a high positioning precision of the edge-emitting semiconductor structure relative to the radiation-generating quantum well structure is advantageously achieved.

With the inventive device, further, a uniform optical pumping of the quantum well structure can be achieved for high output powers in the fundamental mode.

In an advantageous embodiment, the surface-emitting quantum well structure and the pump radiation source are arranged side-by-side on the substrate such that a radiation-emitting region of the pump radiation source and the quantum well structure lie at the same height above the substrate. What is thereby achieved is that pump radiation is laterally coupled into the quantum well structure during operation of the semiconductor laser device. This means that the beam axis of the pump radiation proceeds essentially parallel to the substrate surface and, thus, essentially vertically relative to the beam axis of the laser beam generated by the surface-emitting semiconductor laser device.

Given such a device, the quantum well structure is "pumped" transparently at first from the lateral surfaces during operation until, finally, the entire lateral cross-sectional area thereof is laser active. Due to the lateral optical pumping, moreover, a uniform filling of the quantum wells with charge carriers is achieved.

Preferably, the quantum well structure is surrounded by the edge-emitting semiconductor structure. At least one gain-guided radiation-emitting active region that serves as a pump radiation source is formed therein on the basis of at least one current injection path on the surface of the semiconductor laser structure. Alternatively, at least one index-guided radiation-emitting active region of the edge-emitting semiconductor structure serves as the pump radiation source. This is defined, for example, with at least one current injection path on the surface of the edge-emitting semiconductor structure in combination with, for example, etched trenches in the semiconductor structure fashioned along the current injection path.

Preferably, the ends of the current injection path facing toward the radiation-generating quantum well structure have a spacing of 10 µ through 50 µm, especially preferred approximately 30 µm. As a result thereof, disturbing leakage currents and other disturbing influences at the boundary surfaces between the edge-emitting semiconductor structure and the surface-emitting layer sequence, i.e. the input surfaces for the pump radiation, are reduced.

The aforementioned embodiments can be advantageously fabricated overall with traditional semiconductor process technology.

When, during operation of the device, an adequately high current flows through the injection paths into the active layer of the pump radiation source, an intensified spontaneous emission (super-radiation) is formed, this being guided into the surface-emitting laser region and being absorbed thereat. The electron-hole pairs generated as a result thereof are collected in the quantum well and lead to the inversion in the intensification region of the surface-emitting laser structure.

The excitation of the surface-emitting laser structure can ensue by pumping the quantum well structure or confinement layers adjacent thereto. When pumping the confinement layers, the pump efficiency is preferably enhanced in that the band gap thereof decreases toward the quantum well structure. This, for example, can be achieved by modifying the material composition. As a result thereof, internally electrical fields are generated in the confinement layers that drive the optically generated charge carriers into the active quantum well region.

In an especially preferred embodiment, a plurality of pump radiation sources are arranged star-like around the quantum well structure, so that the quantum well structure is transparently "pumped" and laser-active over its entire lateral cross-section in a short time and very uniformly.

The boundary surface between edge-emitting semiconductor structure and quantum well structure is preferably at least partially reflective. What is thereby achieved is that a back-reflection into the edge-emitting semiconductor structure derives at the edge to the surface-emitting laser region, this leading to the formation of laser radiation in the pump source and, thus, to enhanced pump efficiency.

Generating laser radiation as pump radiation and, thus, enhanced pump efficiency is alternatively achieved in that respectively two pump radiation sources arranged at opposite sides of the quantum well structure together form a laser structure. The end faces of the edge-emitting radiation sources lying parallel to one another and facing away from the quantum well structure are fashioned as mirror surfaces for this purpose and serve as a resonator mirror. These, for example, can be generated by cleaving and/or etching (for example, dry etching) and can be provided with a passivation layer and/or can be highly reflectively mirrored.

The opposite pump radiation sources are coupled during operation via the transparently pumped quantum well structure to form a single, coherently resonating laser. Given optimum end mirroring, the entire optical power stored in the pump laser is then available as pump power except for the losses at the boundary surfaces between the pump laser and surface-emitting laser.

Preferably, the edge-emitting semiconductor structure comprises a large optical cavity (LOC) structure. Given this, an active layer is embedded between a first and a second waveguide layer that are in turn embedded between a first and a second cladding layer.

In an advantageous development of the invention, it is provided that the edge-emitting semiconductor structure be fashioned as a ring laser. Here, a ring laser is a laser structure wherein ring modes can form during operation. The design of the appertaining laser resonator in ring form is thereby advantageous, as to be explained below, but not compulsory.

The resonator of such a ring laser can be formed with totally reflective boundary surfaces, so that no highly reflective mirrors are required. The risk of a lower radiation yield due to damage at the mirrors is thus also reduced. Further, a ring laser is distinguished by an advantageously large mode volume and by a high mode stability.

Preferably, the quantum well structure to be pumped is arranged within the ring resonator, so that the entire resonator-internal radiation field is available for pumping the quantum well structure. It is thereby especially advantageous to arrange the active layer of the edge-emitting semiconductor structure and the quantum well structure at the same height above the substrate, so that a large overlap derives between the volume of the quantum well structure to be pumped and the radiation field of the edge-emitting semiconductor structure and, thus, a high pump efficiency derives.

In an advantageous development of the invention, the resonator of the ring laser is formed by an annularly closed waveguide. The guidance of the pump radiation field therein ensues by total reflection at the limitations of the waveguide, so that highly reflective mirrors are also advantageously not required here. Further, the pump radiation field can be very well-adapted to the volume of the quantum well structure to be pumped as a result of the shaping of the annularly closed waveguide.

The edge-emitting semiconductor structure in a preferred development of the invention is surrounded by a medium whose refractive index is lower than the refractive index of the semiconductor structure. As a result thereof, a totally reflective surface that serves as a limitation of the laser resonator arises at the transition from the semiconductor into the optically thinner, surrounding medium. For forming an annularly closed waveguide, a recess filled with the optically thinner medium can be arranged within the edge-emitting semiconductor structure.

Due to the low refractive index, air or some other gaseous medium is particularly suitable as the surrounding medium. Alternatively, the edge-emitting semiconductor structure can also be surrounded by some other materials such as, for example, a semiconductor material, a semiconductor oxide or a dielectric having a lower refractive index.

Preferably, the semiconductor structure is formed as a cylindrical stack of circular or annular semiconductor layers. The cylindrical semiconductor body shaped in this way simultaneously represents the ring laser resonator at whose cladding surfaces the radiant field is guided in totally reflecting fashion.

Alternatively, the semiconductor structure can also be formed prismatically as a stack of semiconductor layers in the form of polygons or polygonal rings. As a result of this shaping, a largely uniform beam distribution and, correspondingly, a largely homogeneous pump density can be achieved in the quantum well structure.

A stack of semiconductor layers of the described shape can be formed comparatively simply, for example by etching from a previously epitaxially produced semiconductor layer sequence. Advantageously, the laser resonator of the edge-emitting semiconductor structure is simultaneously also formed with the shaping of the semiconductor body without additional mirrorings being required.

In an especially preferred development of the semiconductor device, the quantum well structure has more than ten quantum wells. This high number of quantum wells is possible because all quantum wells are directly pumped as a result of the lateral input of the pump radiation. As a result thereof, a high gain in the surface-emitting quantum well structure is advantageously achieved.

The edge-emitting semiconductor structure is preferably fashioned such that it generates a pump wave whose maximum lies at the height of the quantum wells above the substrate, especially preferably at the level of the center of the quantum well structure.

In order to obtain especially high output powers, the edge-emitting semiconductor structure in an advantageous development is fashioned as what is referred to as a multiple stack or micro-stacked laser having a plurality of laser-active layer sequences (for example, double heterostructures) that are connected in series via tunnel transitions. The quantum well structure then advantageously comprises a plurality of quantum well groups that respectively lie at the height of a laser-active layer sequence of the pump source.

In a preferred method for manufacturing an optically pumped, surface-emitting semiconductor laser device according to the aforementioned embodiments, a first semiconductor layer sequence suitable for a surface-emitting semiconductor laser and having at least one quantum well structure is initially applied onto a substrate. Subsequently, the first semiconductor layer sequence is removed outside the intended laser region. An edge-emitting, second semiconductor layer sequence is deposited subsequently on the region over the substrate that was uncovered after the removal of the first semiconductor layer sequence, the second semiconductor layer sequence being suitable for generating pump radiation and transmitting it into the quantum well structure. Subsequently, at least one current injection path is fashioned in the edge-emitting semiconductor layer sequence.

Preferably, a buffer layer is first applied onto the substrate. A first confinement layer is deposited thereon. A quantum well structure suitable for a surface-emitting semiconductor laser is subsequently applied onto the first confinement layer and this quantum well structure is followed by a second confinement layer. After the removal of the confinement layers and of the quantum well structure and, partially, of the buffer layer outside the intended surface-emitting laser region, a first cladding layer, a first waveguide layer, an active layer, a second waveguide layer and a second cladding layer are successively applied onto the region of the buffer layer that is then uncovered. The respective layer thicknesses are designed such that the pump radiation generated in the active layer proceeds into the quantum well structure.

In another embodiment of the semiconductor laser device according to the invention, the radiation-emitting quantum well structure and the pump radiation source are arranged above one another on the substrate. The quantum well structure is thereby optically coupled to the edge-emitting semiconductor structure, so that pump radiation from the pump radiation source is guided into the quantum well structure during operation of the semiconductor laser device.

The edge-emitting semiconductor structure preferably comprises a first waveguide layer and—as viewed from the substrate—a second waveguide layer following thereupon between which an active layer is arranged. The quantum well structure is epitaxially grown on the second waveguide layer, covers only a sub-region of the edge-emitting semiconductor structure and is optically coupled thereto.

For improving the infeed of the pump radiation into the quantum well structure, the boundary surface between second waveguide layer and adjacent cladding layer is bent or buckled toward the quantum well structure in the proximity of the surface-emitting laser region.

In order to improve the infeed of the pump radiation into the surface-emitting semiconductor structure, the refractive index of the second waveguide layer is advantageously higher than the refractive index of the first waveguide layer and/or the active layer is placed symmetrical in the waveguide fashioned by the two waveguide layers.

Analogous to the above-described, first embodiment, one or more gain-guided and/or index-guide, radiation-emitting active regions are fashioned as pump radiation sources in the edge-emitting semiconductor structure.

In a preferred method for manufacturing an optically pumped, surface-emitting semiconductor laser device according to the aforementioned, second basic embodiment and the developments thereof, an edge-emitting semiconductor laser layer sequence is first applied onto a substrate. A surface-emitting semiconductor laser layer sequence having at least one quantum well structure is then applied thereon. Subsequently, the surface-emitting semiconductor laser layer sequence is removed outside the intended laser region before at least one current injection path is fashioned in the edge-emitting semiconductor layer sequence.

To this end, a buffer layer is preferably first applied onto the substrate. Subsequently, a first waveguide layer, an active layer and a second waveguide layer are deposited successively thereon. A first confinement layer, a surface-emitting semiconductor laser layer sequence having a quantum well structure and a second confinement layer are applied onto the edge-emitting layer sequence produced in this way. The confinement layers, the surface-emitting semiconductor laser layer sequence and, in part, the second waveguide layer are then removed outside the intended surface-emitting laser region.

In an inventive method for manufacturing an optically pumped, surface-emitting semiconductor laser device having a ring laser as a pump radiation source, a surface-emitting semiconductor layer sequence having at least one quantum well structure—as already set forth is initially applied on a substrate, the layer sequence is removed outside the planned laser region, and the edge-emitting semiconductor structure of the pump radiation source is applied onto the region uncovered as a result thereof.

Subsequently, the outside region of the edge-emitting semiconductor structure is removed for shaping the laser resonator. A central sub-region in the inside of the semiconductor structure is thereby also preferably eroded for forming a ring resonator. The removal of the sub-regions can, for example, ensue with a dry etching process. Advantageously, a complicated post-processing of the etched surfaces is not required.

Alternatively, the method steps can also be applied in a different sequence. For example, an edge-emitting semiconductor structure can be applied first on the substrate, this then being eroded in the planned laser region of the quantum well structure (which is yet to be formed). In the next step, the surface-emitting semiconductor layer sequence having at least one quantum well structure is applied on the uncovered region. Subsequently, the outside region of the edge-emitting semiconductor structure is again removed for shaping the laser resonator. In a modification of the method, the shaping of the laser resonator can also occur before the application of the surface-emitting semiconductor layer sequence.

In a preferred development of the two above-recited embodiments, a highly reflective Bragg reflector layer sequence is fashioned at one side of the quantum well structure, this representing a resonator mirror of the surface-emitting laser structure. A further Bragg reflector layer sequence or an external mirror is arranged at the opposite side of the quantum well structure as second, partially transmissive resonator mirror.

Preferably, the substrate is composed of a material that is transmissive for the laser beam generated in the semiconductor laser device, and the highly reflective Bragg reflector is arranged at that side of the quantum well structure facing away from the substrate. This enables a short connection between the semiconductor structures and a heat sink and, thus, a good heat elimination from the semiconductor structures.

In order to prevent disturbing transverse modes (modes parallel to the substrate—whispering modes), absorber layers are arranged in the edge region and/or in etching structures of the surface-emitting semiconductor laser layer sequence.

The inventive semiconductor laser device is particularly suitable for employment in an external resonator wherein a frequency-selected element and/or a frequency doubler is located.

Advantageously, the inventive semiconductor laser device—via modulation of the pump laser—can be modulated by modulation of the pump current or via a short-circuit connection of the surface-emitting semiconductor laser layer sequence.

Further advantageous developments and improvements of the device and of the method of the invention derive from the exemplary embodiments described below in conjunction with FIGS. 1 through 14.

DESCRIPTION OF THE DRAWINGS

FIGS. 2a through 2e show a schematic illustration of a method sequence for manufacturing the exemplary embodiment according to FIG. 1.

FIG. 3a shows a schematic illustration of a section through a second exemplary embodiment.

FIG. 3b shows a schematic illustration of an advantageous development of the waveguide of the exemplary embodiment according to FIG. 3a.

FIGS. 4a through 4c show a schematic illustration of a method sequence for manufacturing the exemplary embodiment according to FIG. 3.

FIG. 5 shows a schematic illustration of a plan view onto a first arrangement of current injection paths on an edge-emitting semiconductor structure.

FIG. 6 shows a schematic illustration of a plan view onto a second arrangement of current injection paths on an edge-emitting semiconductor structure.

FIG. 7 shows a schematic illustration of a plan view onto a third arrangement of current injection paths on an edge-emitting semiconductor structure.

FIGS. 12 and 12b show a schematic illustration of a method sequence for manufacturing the exemplary embodiment according to FIG. 9.

DETAILED DESCRIPTION OF THE PREFERRED EMBODIMENTS

Figure 1:
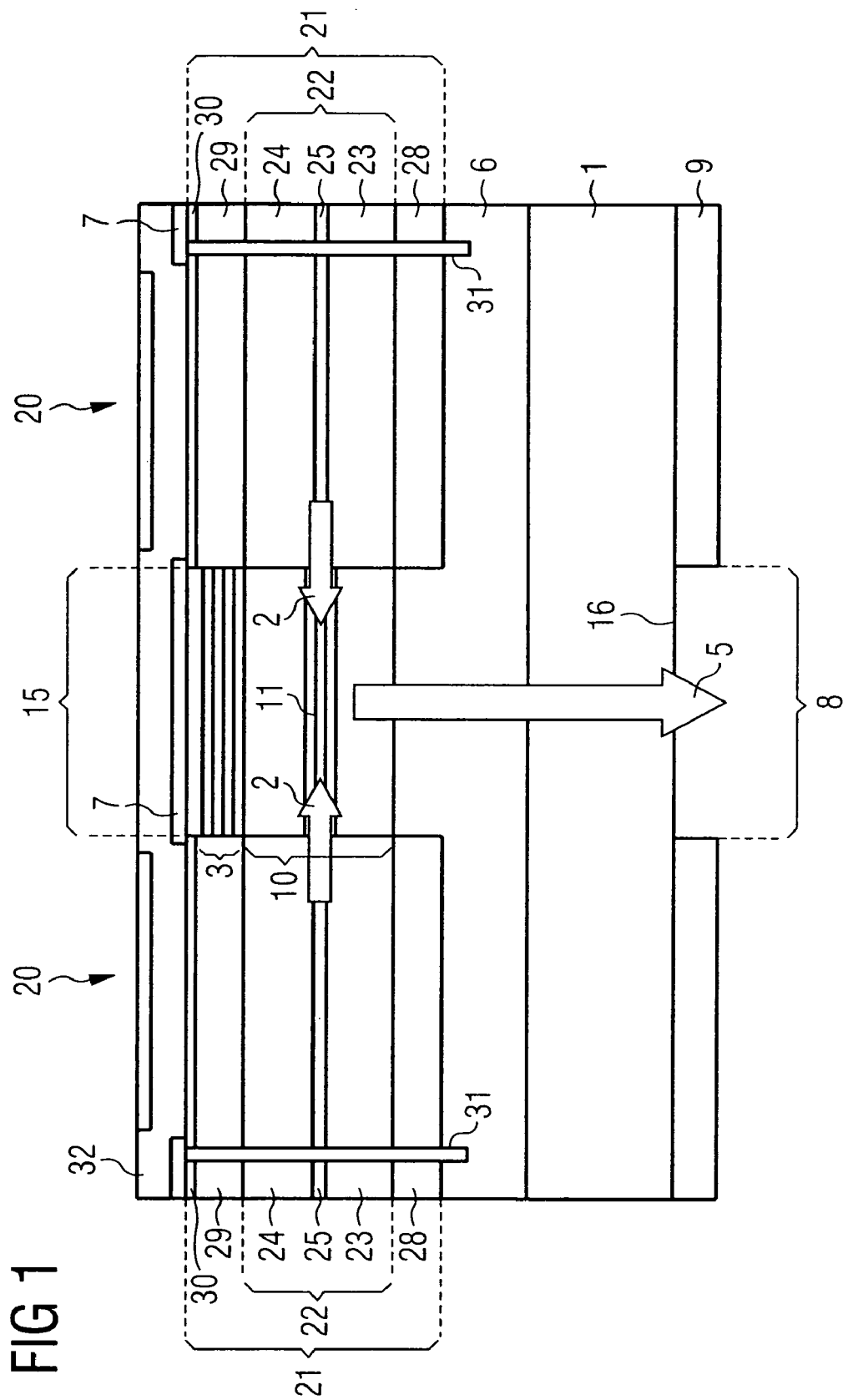
FIG. 1 shows a schematic illustration of a section through a first exemplary embodiment.

Identical elements or elements having the same effect are provided with the same reference characters in the Figures.

The exemplary embodiment of FIG. 1 is, for example, an optically pumped surface-emitting semiconductor laser chip having a laser emission at 1030 nm. Therein, a buffer layer 6 is applied on a substrate 1. The substrate 1 is composed, for example, of GaAs and the buffer layer 6 is composed of undoped GaAs.

A surface-emitting semiconductor laser structure 10 having a quantum well structure 11 is applied on the buffer layer 6 centrally over the substrate, this representing the surface-emitting laser region 15. The semiconductor laser structure 10 is composed of a first confinement layer 12 located directly on the buffer layer 6, of a quantum well structure 11 arranged on the confinement layer 12 and of a second confinement layer 13 applied on the quantum well structure 11.

The confinement layers 12 and 13 are composed, for example, of undoped GaAs, and the quantum well structure 11 comprises, for example, a plurality ($\geq 3$) of quantum wells that are composed of undoped InGaAs whose thickness is set to the emission at 1030 nm and between which barrier layers of GaAs are located.

A Bragg mirror 3 having, for example, 28 through 30 periods GaAlAs (10% Al)/GaAlAs (90% Al) that represents a highly reflective resonator mirror is deposited over the surface-emitting semiconductor laser structure.

An edge-emitting semiconductor laser structure 21, for example a large optical cavity (LOC) single quantum well (SQW) laser structure for an emission at approximately 1 μm, is deposited in the environment of the laser region 15 on the buffer layer 6. This structure 21 is composed, for example, of a first cladding layer 28 (for example, n-GaAl$_{0.65}$As), of a first waveguide layer 23 (for example, n-GaAl$_{0.1}$As), of an active layer 25 (for example, an undoped InGaAs-SQW), of a second waveguide layer 24 (for example, p-GaAl$_{0.1}$As) and of a second cladding layer 29 (for example, p-GaAl$_{0.65}$As).

For example, a p$^+$-doped GaAs layer can be applied on the second cladding layer 29 as a cover layer 30.

The LOC region 22 is arranged at the same height as the quantum well region of the surface-emitting laser structure 10; preferably, the active layer 25 is located at the same height above the substrate 1 as the quantum well structure 11.

In a particular embodiment of the exemplary embodiment, the edge-emitting semiconductor structure 21 comprises a plurality of active layers 25 that are connected in series via tunnel transitions. Analogous thereto, the quantum well structure 11 comprises a plurality of quantum well groups that respectively lie at the height of an active layer 25 of the edge-emitting semiconductor structure 21.

All semiconductor layers are, for example, produced with metallorganic vapor phase epitaxy (MOVPE).

In the mirrors 31 proceeding perpendicular to the layers of the edge-emitting semiconductor laser structure 21 are located in the proximity of the outer edge of the edge-emitting semiconductor laser structure 21, these end mirrors 31 extending at least into the first cladding layer 28, here up to the buffer layer 6, proceeding from the cover layer 30. For example, these are produced after the growth of the edge-emitting semiconductor laser structure 21 by etching (for example, reactive ion etching) of corresponding trenches and the subsequent filling thereof with highly reflective material. Respectively two mirrors 31 parallel to one another are arranged at opposite sides of the quantum well structure 11 (see FIGS. 5 and 6).

Alternatively, the end mirrors can be manufactured in a known way by cleaving along crystal planes. As shown in FIG. 1, these are then not necessarily arranged in the chip but are formed by the cleaved chip lateral surfaces (see FIG. 7).

In electrically insulating mask layer 7, for example a silicon nitride, an aluminum oxide or a silicon oxide layer, with which current injection paths 26 of the edge-emitting semi-conductor laser structure 21 are defined are located on the free surface of the cover layer 30 and of the Bragg mirror 3 (see FIGS. 5 and 6. A p-contact layer 32, for example a known contact metallization, is applied on the mask layer 7 and—in the recesses-thereof for the current injection paths 26—on the cover layer 30.

For example, six stripe arrays each having 15 stripes (4 μm stripe, 10 μ pitch) with approximately 150 μm active width that are arranged symmetrically star-shaped around the surface-emitting laser region 15 are selected for the pump source.

Preferably, the ends of the current injection paths 26 facing toward the radiation-generating quantum well structure 11 have a spacing of 10 μm through 50 μm, particularly preferably of approximately 30 μm, therefrom. As a result thereof, disturbing leakage currents and other disturbing influences at the boundary surfaces between the edge-emitting semiconductor structure 21 and the surface-emitting layer sequence 10 are reduced, i.e. at the infeed surfaces for the pump radiation 2.

All current injection paths 26 can be provided with a common p-contact layer 32, as a result whereof the radiation-emitting regions of the edge-emitting structure are connected parallel to one another in operation. Given an intended, separate drive of these individual radiation-emitting regions, a correspondingly structured p-conductive, first contact layer 32 is applied. As a result thereof, an optimized pump light distribution (for example, similar to a Gauss profile) can be produced over the lateral cross-section of the surface-emitting structure.

For generating index-guided pump regions in the edge-emitting structure 21, -trenches manufactured, for example, by etching can be formed therein along the current injection paths 26 (the trenches being shown in the FIGS. 5 and 6), these extending, for example, up to 0.5 μm into the second waveguide layer 24. As a result thereof, an improved wave guidance is achieved at the edges of the pump regions.

The principal surface 16 of the substrate 1 facing away from the semiconductor structure is provided with an n-conductive, second contact layer 9, for example likewise a known contact metallization, except for an exit window 8 for the laser beam (indicated with the arrow 5).

The principal surface 16 of the substrate is preferably anti-bloomed in the region of the exit window 8 in order to reduce back-reflections into the chip.

A laser resonator of the surface-emitting laser structure 10 can be fashioned as a Bragg mirror 3 and an external, further mirror (not shown in FIG. 1) arranged at the opposite side of the substrate 1 or can be formed of a further Bragg mirror arranged between the substrate 1 and the quantum well structure 11.

During operation of the semiconductor chip, pump radiation (indicated by the arrows 2) is generated in a region of the edge-emitting semiconductor structure 21 that represents the pump radiation source 20 and that are defined by the current injection paths 26, and this pump radiation is coupled into the quantum well structure 11 of the surface-emitting laser structure 10.

Given adequate back-reflection at the boundary surface between the edge-emitting structure 21 and the surface-emitting structure 10 and a suitable position of the end mirrors 31, laser radiation that leads to an enhanced pump efficiency is generated in the edge-emitting structure 21.

Preferably, the end mirrors 31 are arranged such relative to one another that these form a laser resonator for two radiation-emitting regions of the edge-emitting structure 21 that lie opposite one another. The two radiation-emitting regions lying opposite one another are then coupled to form a single coherently resonating laser after the transparent pumping of the surface-emitting laser structure 10. Given optimum mirroring of the end mirrors 31., the entire optical power generated by the pump laser is available as pump power except for losses at the boundary surface between the edge-emitting structure 21 and the surface-emitting structure 10.

Figure 2D:
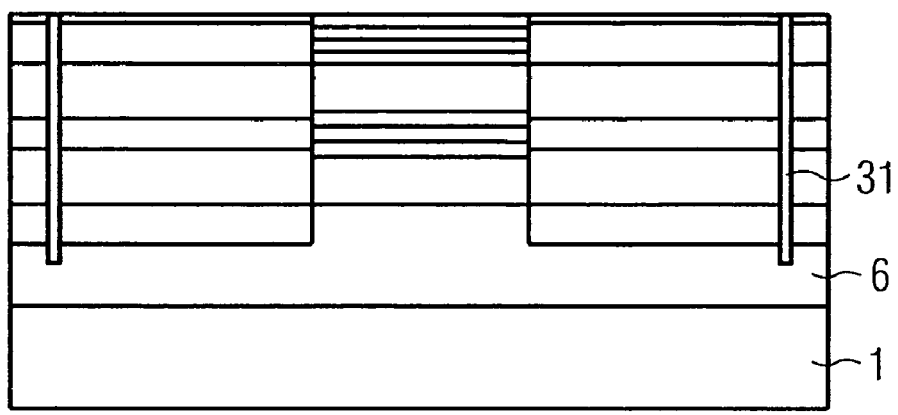

Given the method schematically shown in FIGS. 2a through 2e for manufacturing the exemplary embodiment according to FIG. 1, the buffer layer 6, the first confinement layer 12, the quantum well structure 11, the second confinement layer 13 and the Bragg mirror layers 3 are initially successively applied onto the substrate 1, for example by MOVPE (FIG. 2a).

Subsequently, an etching mask 17 (for example, a Si-nitride mask), is applied onto the region of this layer sequence provided as a surface-emitting laser region 15. Subsequently, the Bragg mirror layers 3, the confinement layers 12 and 13, the quantum well structure 11 and, in part, the buffer layer 6 are removed, for example by etching, for example dry-etching with Cl chemistry, outside the intended surface-emitting laser region 15 (FIG. 2b). The first cladding layer 28, the first waveguide layer 23, the active layer 25, the second waveguide layer 24, the second cladding layer 29 and the cover layer 30 are successively applied then on the uncovered region of the buffer layer 6, for example again with MOVPE (FIG. 2c).

With, for example, reactive ion etching and suitably known mask technology, trenches for the end mirrors 31 are then etched (see FIG. 2d) in the most recently applied edge-emitting structure 21, these trenches being subsequently coated or filled with reflection-enhancing material. The etching mask 17 is also removed.

Figure 2E:
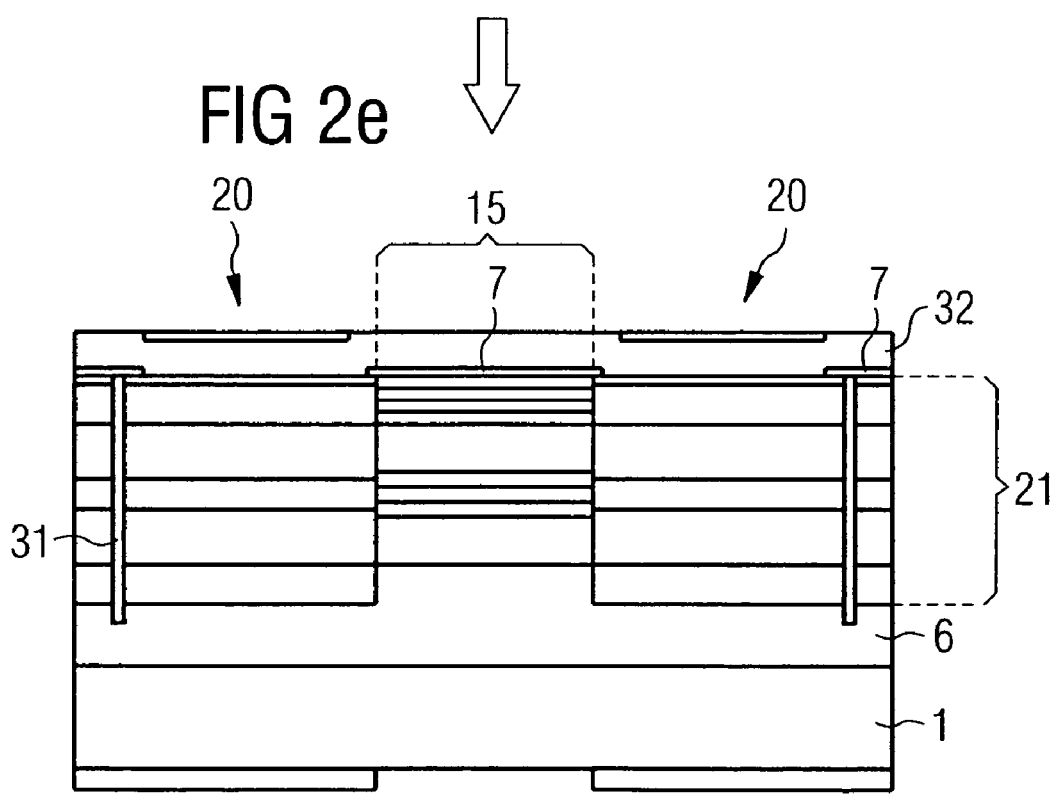

Subsequently, the electrically insulating mask layer 7 is applied onto the cover layer 30 and onto the Bragg mirror 3 before the p-contact layer 32 and the n-contact layer 9 are finally produced (FIG. 2e).

Before the application of the insulating mask layer 7, the trenches described above in conjunction with FIG. 1 are optionally produced for generating index-guided pump lasers, being produced by etching.

In order to reduce radiation losses, the substrate 1 is preferably thinned to less than 100 μm or completely removed after the MOVPE.

In the exemplary embodiment according to FIG. 3, a buffer layer 6 is initially situated surface-wide on the substrate 1 and an edge-emitting semiconductor laser structure 21 is arranged thereon surface-wide wherein an active layer 25 is arranged between a first waveguide layer 23 and a second waveguide layer 24.

In a planned laser region 15 over the middle of the substrate 1, a surface-emitting quantum well structure 11 is grown on the second waveguide layer 24 followed by a confinement layer 13 and a Bragg mirror layer sequence 3.

An electrically insulating mask layer 7 that comprises recesses for current injection paths 26 of the edge-emitting structure 21 (see FIG. 7) is applied in the region around the laser region 15 onto the second waveguide layer 24 or, potentially, onto a highly doped cover layer applied thereon. A first contact layer 32 is located on the electrically insulating mask layer 7 and in the recesses thereof on the second semiconductor layer or, on the cover layer and a second contact layer 9 having an exit window for the laser beam (indicated with the arrow 5) is arranged at that side of the substrate 1 lying there opposite.

For producing index-guided pump regions in the edge-emitting structure 21, trenches manufactured, for example, by etching can be fashioned (shown in the FIGS. 5 and 6) in the second waveguide layer 24 along the current injection paths 26. An improved waveguidance at the edges of the pump regions is achieved as a result thereof.

Cleaved sidewalls of the chip, for example, are provided here as end mirrors 31 of the edge-emitting structure 21.

During operation, pump laser radiation is generated in the edge-emitting laser structure, a part thereof being coupled into the quantum well structure 11 lying thereabove.

In order to promote the infeed, the active layer 25 is asymmetrically located in the waveguide formed by the two waveguide layers 23 and 24. Alternatively or additionally, the refractive index of the second waveguide layer 24 can be higher than that of the first waveguide layer 23 and/or the second waveguide layer can be pulled up toward the laser region 15 in the direction of the quantum well structure 11 for the same purpose (See FIG. 3b).

The materials recited for the corresponding layers of the exemplary embodiment according to FIG. 1 can be used by way of example here as materials for the various layers.

A laser resonator of the surface-emitting laser structure 10 can also be formed in this exemplary embodiment from the Bragg mirror 3 and from an external, further mirror (not shown in FIG. 3a) arranged at the opposite side of the substrate 1 or a further Bragg mirror arranged between the substrate 1 and the quantum well structure 11.

Given the method for manufacturing a device according to the exemplary embodiment of FIG. 3a that is schematically shown in FIGS. 4a through 4c, a buffer layer 6 is first applied onto the substrate 1. The first waveguide layer 23, the active layer 25 and the second waveguide layer 24 are subsequently successively grown thereon. Subsequently, the quantum well structure 11 is grown onto the second waveguide layer 24, followed by the confinement layer 13 and the Bragg mirror layer 3 (FIG. 4a). These layers are produced, for example, with MOVPE.

Subsequently, an etching mask 17 is applied onto the sub-region of the layer sequence that has been grown and that is provided as laser region 15, and the Bragg mirror layer 3, the confinement layer 13, the quantum well structure 11 and, in part, the second waveguide layer 24 are removed outside the laser region 15 with etching (FIG. 4b).

Subsequently and for definition of the current injection paths 26, the electrically insulating mask layer 7 is applied onto the second waveguide layer 24 before the contact layer 32 is then deposited.

Subsequently, the second contact layer 9 having an exit window 8 is applied onto the principal surface of the substrate 1 lying opposite the semiconductor layer sequence (FIG. 4c).

In order to reduce radiation losses, the substrate 1 here is also preferably thinned too, for example, less then 100 µm or is completely removed following the MOVPE.

The inventive, so-called wafer lasers are preferably soldered with the Bragg mirror down onto a heat sink. One electrode is located on the heat sink and the second is generated by bonding on the wafer laser surface.

Figure 8B:
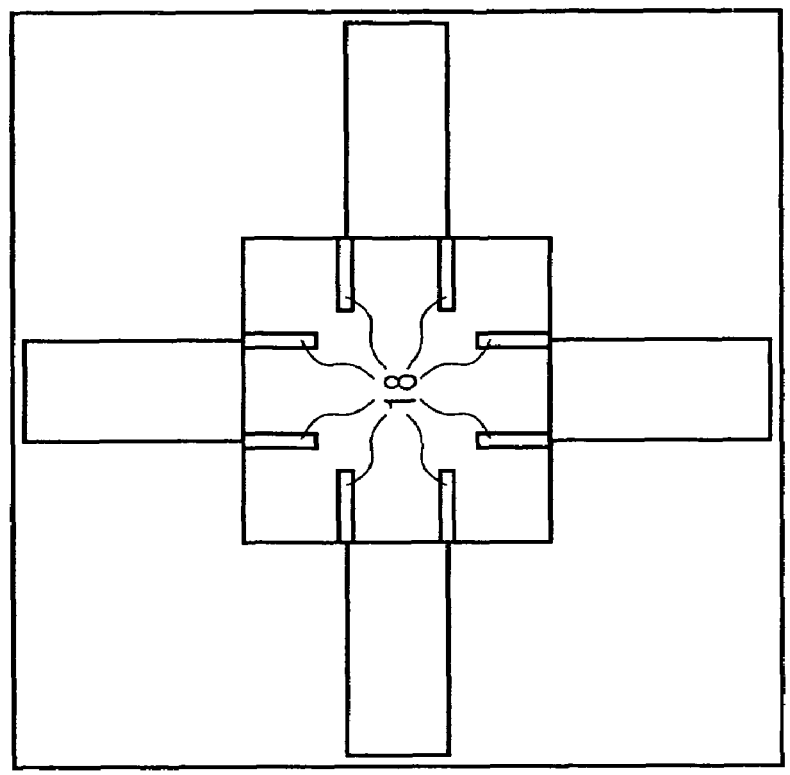
FIGS. 8a and 8b show a schematic illustrations of semi-conductor laser devices with absorber layer.
Figure 8A:
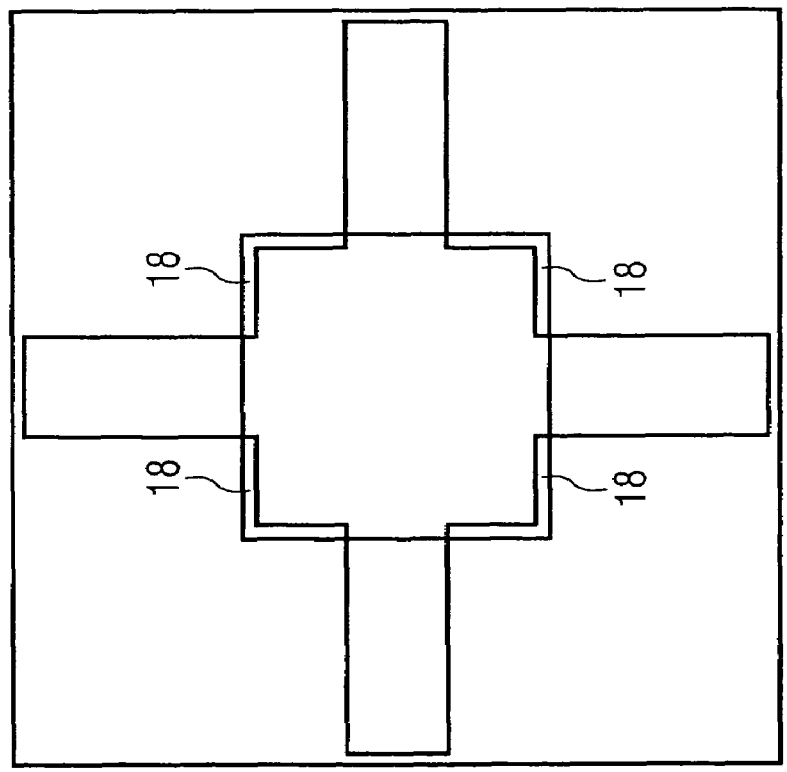

In order to prevent disturbing transverse modes (modes parallel to the substrate—whispering modes), absorber layers 18 (see FIGS. 8a and 8b) are arranged in the edge region and/or in etched structures of the surface-emitting semiconductor laser layer sequence 15. Suitable absorber materials for such applications are known and are therefore not explained in greater detail here.

Figure 9A:
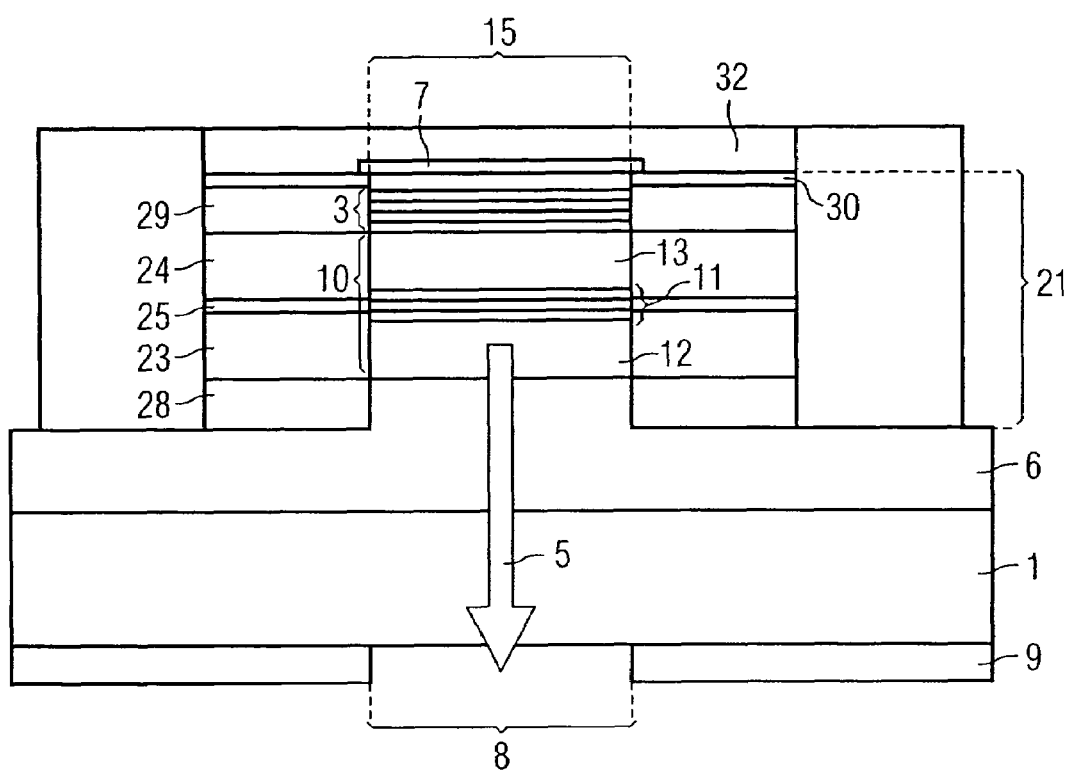
FIGS. 9a and 9b show a schematic illustration of a section and of a plan view of a first exemplary embodiment having a ring laser as pump radiation source.

FIG. 9a shows a section through an exemplary embodiment of an optically pumped, surface-emitting semiconductor device having a ring laser as the pump radiation source. The sequence of the individual semiconductor layers essentially corresponds to the exemplary embodiment shown in FIG. 1.

Differing from the semiconductor device shown in FIG. 1, the edge-emitting semiconductor structure 21, comprising the first cladding layer 28 (for example, n-GaAl$_{0.6}$5As), the first waveguide layer 23 (for example, n-GaAl$_{0.1}$As), the active layer 25 (for example, InGaAs-SQW), the second waveguide layer 24 (for example, p-GaAl$_{0.1}$As) and the second cladding layer 29 (for example, p-GaAl$_{0.65}$As), as a ring laser.

Figure 9B:
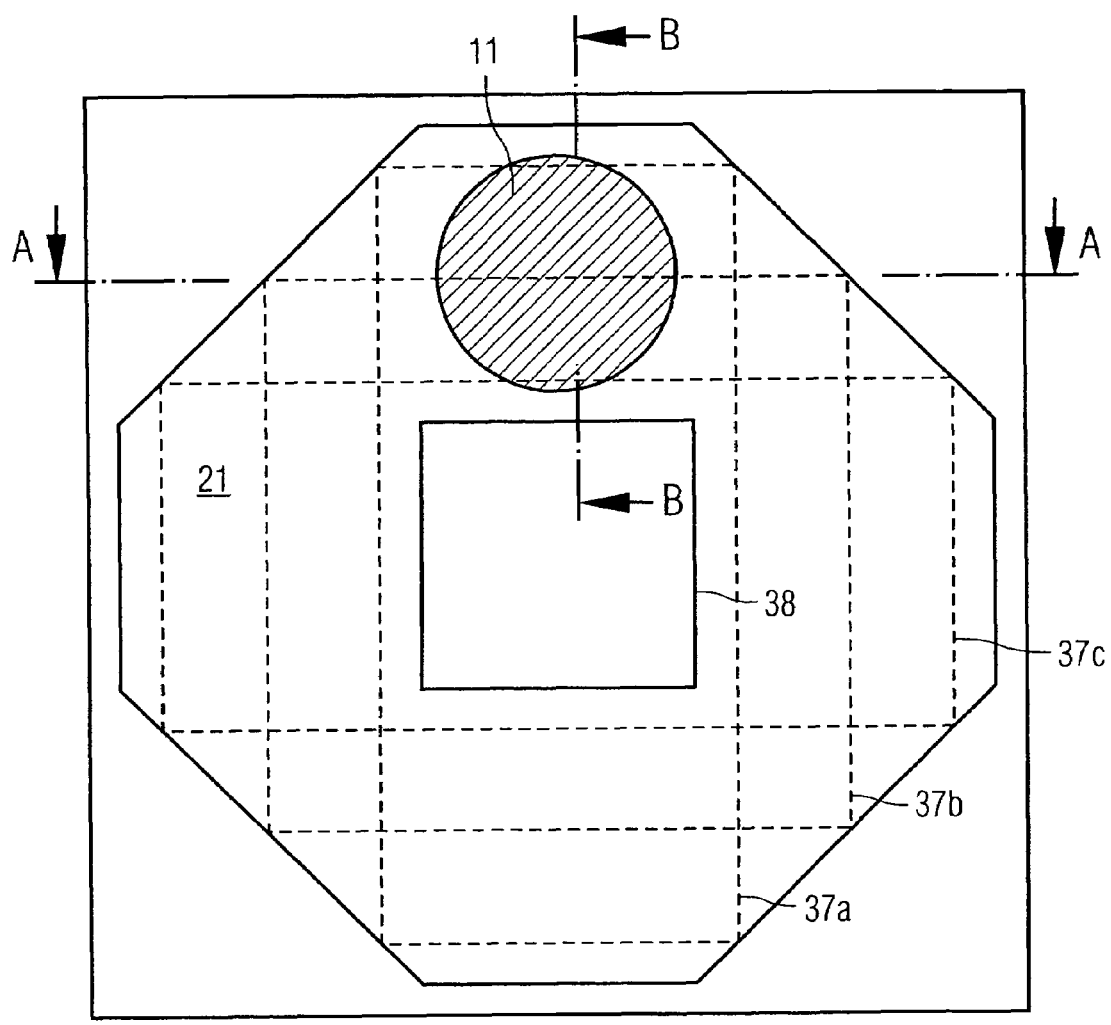

The plan view onto the semiconductor body shown in FIG. 9b illustrates this. The sectional view according to FIG. 9a corresponds to a vertical section along line A-A.

In the plan view, the edge-emitting semiconductor structure 21 comprises an octagonal shape having four full rotational symmetry as well as a quadratic, central recess 38. The quantum well structure to be pumped and which is circular in the plan view is completely arranged within the octagonal ring formed in this way. This octagonal ring forms a ring resonator in the form of a totally reflective, closed waveguide.

During operation, cyclically circulating ring modes resonate in this waveguide, illustrated, for example, with reference to the modes 37a, b and c, these optically pumping the quantum well structure 11. As a result of the total reflection at the outside surfaces, the output losses in this exemplary embodiment are extremely low, so that the entire resonator-internal radiation field is advantageously available for pumping the quantum well structure 11.

As a result of the illustrated shaping of the octagonal ring, the ring modes 37a, 37b and 37c are essentially of the same priority and propagate uniformly. A largely uniform radiation field thus derives in the radial direction (along the line B-B) and, correspondingly, a largely uniform pump density derives in the quantum well structure 11 to be pumped.

Figure 13:
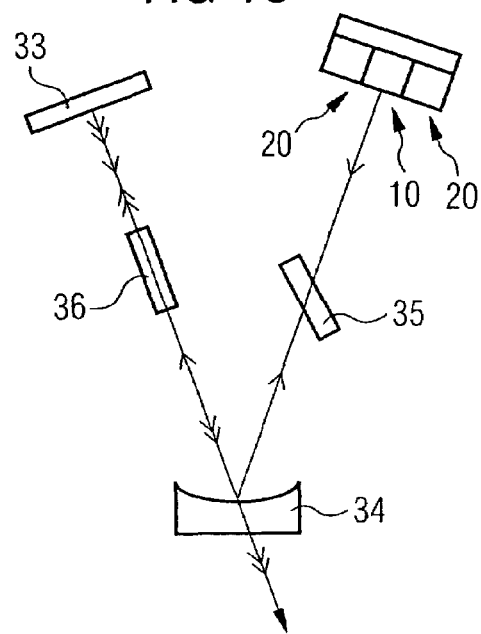
FIG. 13 shows a schematic illustration of an inventive semiconductor laser device having an external resonator.

The second mirror required for a laser mode of the surface-emitting semiconductor laser structure 10 is not integrated in the semiconductor body in the illustrated exemplary embodiment but is provided as an external mirror (also see FIG. 13). Alternatively, this second mirror can also be fashioned in the semiconductor body in a way (not shown) similar to the mirror 3. In this case, the second mirror would have to be arranged, for example, within the provided laser region 15 between the buffer layer 6 and the quantum well structure 11.

Figure 10:
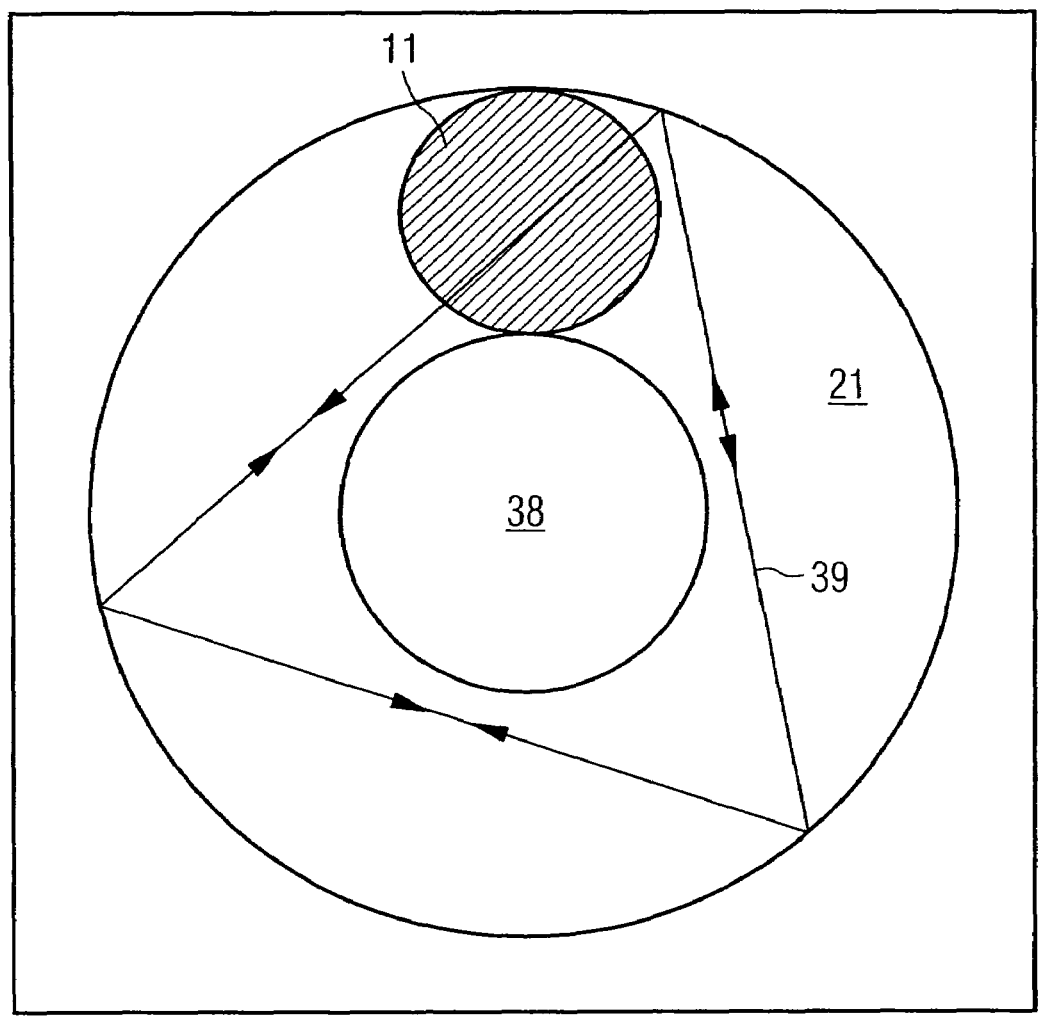
FIG. 10 shows a schematic illustration of a plan view of a second exemplary embodiment having a ring laser as pump radiation source.

FIG. 10 shows another exemplary embodiment of an inventive semiconductor laser device in plan view. Differing from the exemplary embodiment described above, the totally reflective waveguide is fashioned as a circular ring here. The quantum well structure 11 to be pumped is completely arranged within the ring region.

A plurality of ring modes can resonate within the annular resonator. The illustrated mode 39 merely indicates one possible example. The quantum well structure 11, additionally, is pumped by a plurality of further modes with high efficiency.

As derives from FIG. 10, the central recess 38 can also be foregone for simplification, so that the resonator comprises a solid circular area in cross-section. As a result thereof, the manufacturing outlay is advantageously reduced. However, modes that proceed through the resonator center can then resonate up to a certain extent. These modes are not totally reflected at the resonator limitation and therefore have comparatively high output losses that ultimately reduce the pump efficiency.

Figure 11A:
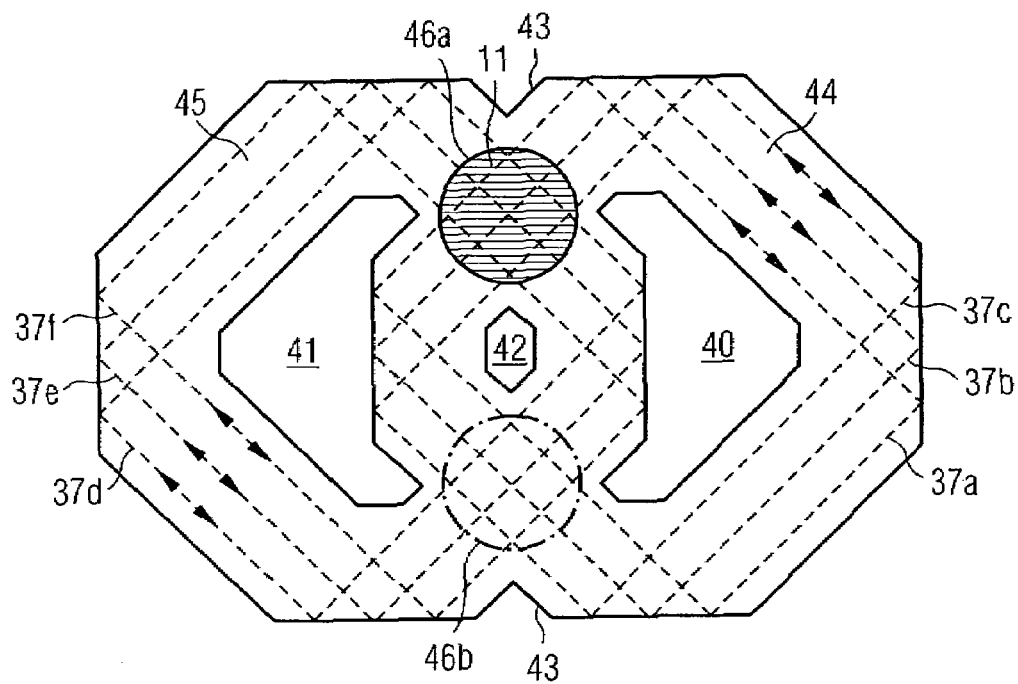
FIGS. 11a and 11b show a schematic illustration of a plan view of a third and fourth exemplary embodiment having respectively two ring lasers as pump radiation sources.

FIG. 11a shows a further exemplary embodiment of the invention wherein the quantum well structure 11 is pumped by two ring lasers that are independent of one another. These are fundamentally constructed like the ring laser of the first exemplary embodiment.

The appertaining waveguides 44 and 45 cross in two regions 46a and b, whereby the quantum well structure 11 to be pumped is arranged in the region 46a. The pump density in the quantum well structure 11 is enhanced further with this arrangement having two ring lasers. The essential pump modes are again shown by way of example with reference to the modes 37a, b, c, d, e and f. Advantageously, a largely uniform pump density again derives here as in the case of the first exemplary embodiment.

Figure 11B:
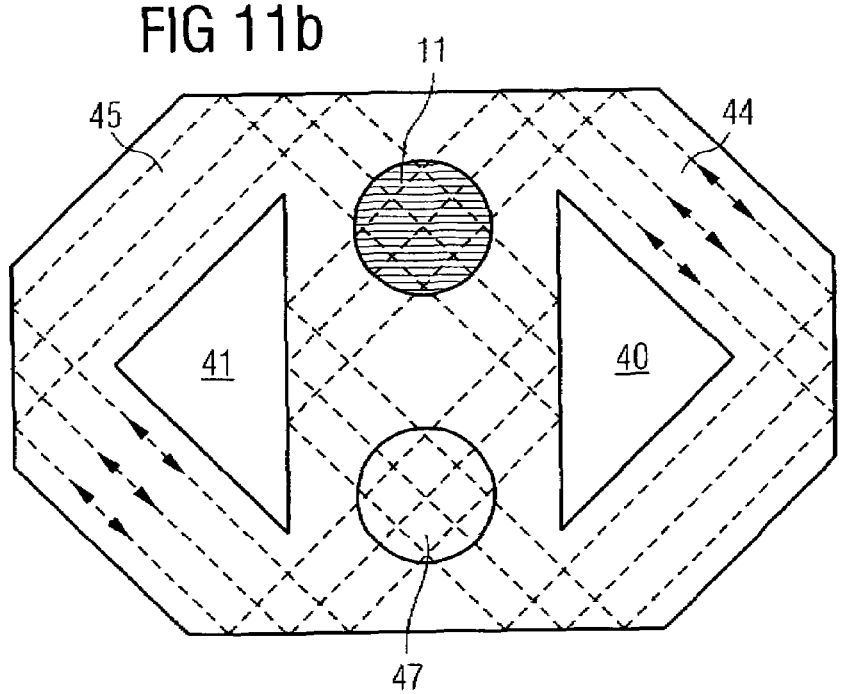

FIG. 11b shows an advantageous version of the arrangement shown in FIG. 3a that is particularly distinguished in that the shaping of the crossing, annular waveguides 44 and 45 is simplified. To that end, the cross-sections of the central recesses 40 and 41 are reduced to triangles. The lateral recesses 43 shown in FIG. 11a and the central recess 42 are foregone. The manufacturing outlay is advantageously reduced as a result of this simplification without significantly deteriorating the laser function.

As indicated in FIG. 11b, a second quantum well structure 47 could, further, also be fashioned in the second crossing region 46b of the two ring lasers.

FIG. 12 schematically shows two method steps for manufacturing an inventive semiconductor laser device.

As already described and shown in FIGS. 2a, 2b and 2c, the method begins with the application of the buffer layer 6, of the first confinement layer 12, of the quantum well structure 11, of the second confinement layer 13 and of the Bragg mirror layers 3 on a substrate 1, for example with MOVPE. Subsequently, an etching mask 7 is applied onto the region of this layer sequence provided as the surface-emitting laser region 15, and the stack of Bragg mirror layers 3, confinement layers 12 and 13, quantum well structure 11 and parts of the buffer layer 6 outside the intended surface-laser region 15 are removed. The first cladding layer 28, the first waveguide layer 23, the active layer 25, the second waveguide layer 24, the second cladding layer 29 and the cover layer 30 are successively applied onto the uncovered region of the buffer layer 6, for example again with MOVPE (not shown, see FIGS. 2a, b, c).

According to FIG. 12a, subsequently, the outside regions and the central region of the semiconductor structure are eroded for forming the totally reflective, closed waveguide. This, for example, can ensue with reactive ion etching upon employment of a suitable, known mask technique.

The lateral surfaces of the edge-emitting semiconductor structure manufactured in this way require no optical coating and forming a nearly loss-free ring laser resonator.

Finally, the etching mask 17 is removed, the electrically insulating mask layer 7 is applied onto the Bragg mirror 11 and the surface is covered with a p-contact layer 32. The substrate is provided with n-contact surfaces 9 (FIG. 12b).

The inventive semiconductor laser devices particularly suited for employment in an external resonator with an external mirror 33 and a partially transmissive concave reflection mirror 34 in which a frequency-selected element 35 and/or a frequency doubler 36 is located (see FIG. 13).

Figure 14:
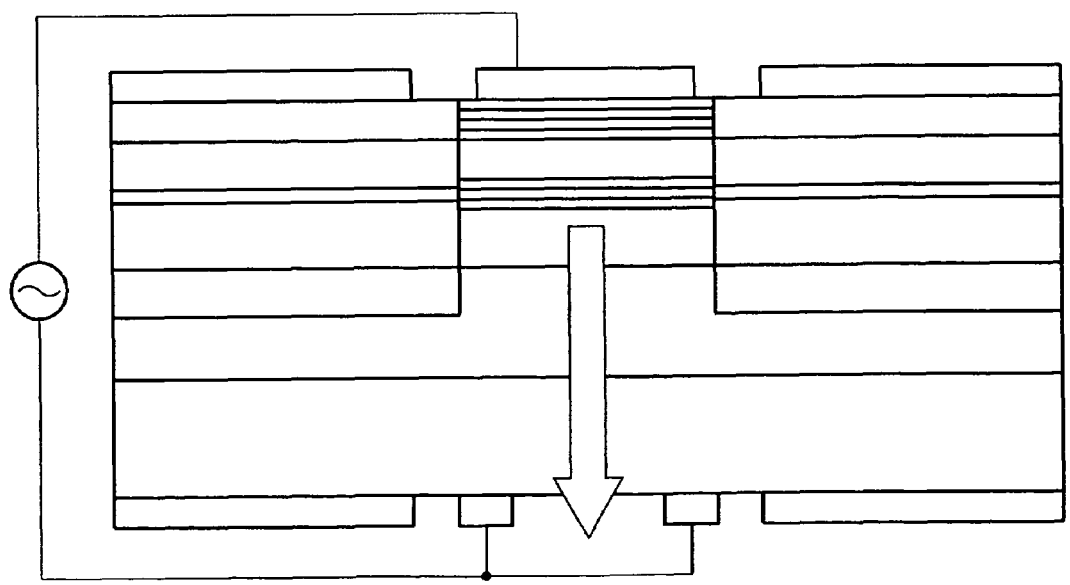
FIG. 14 shows a schematic illustration of a modulatable semiconductor laser device of the invention.

Advantageously, the inventive semiconductor laser device can then be modulated via modulation of the pump source (by modulating the pump current) or via a short-circuit connection of the surface-emitting semiconductor laser layer sequence (FIG. 14).

The above-described structures can be employed not only in the InGaAlAs employed by way of example but, for example, can also be employed in the InGaN, InGaAsP or in the InGaAlP system.

Given a wafer laser in the InGaN system for an emission at 470 nm, the quantum wells are composed, for example InGaN for 450 nm emission, the confinement layers are composed of InGaN with a reduced refractive index, and the Bragg mirrors are composed of an InGaAlN system. The pump laser structure comprises an active region with quantum wells of InGaN for emission at approximately 400 nm as well as waveguide layers and cladding layers of GaAlN, wherein the desired refractive indices are set by variation of the Al content.

Although other modifications and changes may be suggested by those skilled in the art, it is the intention of the inventors to embody within the patent warranted hereon all changes and modifications as reasonably and properly come within the scope of their contribution to the art.

We claim:

1. An optically pumped surface-emitting semiconductor laser device comprising:
    a radiation-generating quantum confinement structure formed by a semiconductor layer sequence, said radiation-generating quantum confinement structure being provided for generating radiation in a single resonator, said semiconductor layer sequence being epitaxially grown on a common substrate, said single resonator being an external resonator;
    a pump radiation source with a radiation region for optically pumping the radiation generating quantum confinement structure, said pump radiation source including an edge-emitting semiconductor structure, said edge-emitting semiconductor structure being formed by the semiconductor layer sequence being epitaxially grown on the common substrate; and
    a boundary surface between the edge-emitting semiconductor structure and the radiation generating quantum confinement structure, the boundary surface being partially reflective.

2. The optically pumped surface-emitting semiconductor laser device according to claim 1, wherein the radiation generating quantum confinement structure and the pump radiation source are being arranged side-by-side such that:
    the radiation-generating quantum confinement structure and the radiation-emitting region of the pump radiation source lie at a same height above the common substrate; and
    a pump radiation from the pump radiation source is being laterally coupled into the radiation generating quantum confinement structure during operation of the optically pumped surface emitting semiconductor laser device.

3. The optically pumped surface-emitting semiconductor laser device according to claim 2, wherein:
    the radiation-generating quantum confinement structure is surrounded by the edge-emitting semiconductor structure; and
    the pump radiation source is a gain-guided radiation-emitting active region formed on a basis of a current injection path on a surface of the edge-emitting semiconductor laser structure.

4. The optically pumped surface-emitting semiconductor laser device according to claim 2, wherein:
    the radiation-generating quantum confinement structure is surrounded by the edge-emitting semiconductor structure; and
    the pump radiation source is an index-guided radiation-emitting active region that is defined on a basis of a current injection path on a surface of the edge emitting semiconductor structure in combination with trenches in the edge-emitting semiconductor structure formed along a current injection path.

5. The optically pumped surface-emitting semiconductor laser device according to claim 4, wherein ends of current injection paths facing toward the radiation-generating quantum confinement structure include a spacing of 10 µm-50 µm therefrom.

6. The optically pumped surface-emitting semiconductor laser device according to claim 1, wherein the pump radiation source includes two pump radiation sources being arranged at opposite sides of the radiation generating quantum confinement structure, said two pump radiation sources for emitting pump radiation into the radiation generating quantum confinement structure during operation.

7. The optically pumped surface-emitting semiconductor laser device according to claim 1, wherein the pump radiation source includes a plurality of pump radiation sources arranged in a star-like manner around the radiation generating quantum confinement structure, and said plurality of pump radiation sources emit pump radiation into the radiation generating quantum confinement structure during operation.

8. The optically pumped surface-emitting semiconductor laser device according to claim 6, wherein the two pump radiation sources together form a laser structure for an optical pumping with laser emission.

9. The optically pumped surface-emitting semiconductor laser device according to claim 1, wherein the pump radiation source includes a ring laser.

10. The optically pumped-surface emitting semiconductor laser device according to claim 9, wherein the radiation generating quantum confinement structure is arranged within a resonator of the ring laser.

11. The optically pumped surface-emitting semiconductor laser device according to claim 10, wherein the resonator of the ring laser is formed by an annularly closed waveguide.

12. The optically pumped surface-emitting semiconductor laser device according to claim 9, wherein the edge-emitting semiconductor structure is surrounded by a medium with a refractive index less than a refractive index of the edge-emitting semiconductor structure.

13. The optically pumped surface-emitting semiconductor laser device according to claim 9, wherein the edge-emitting semiconductor structure is surrounded by at least one of a gaseous medium and a dielectric.

14. The optically pumped surface-emitting semiconductor laser device according to claim 9, wherein the edge-emitting semiconductor structure is formed as a cylindrical body with one of a circular and annular cross section.

15. The optically pumped surface-emitting semiconductor laser device according to claim 9, wherein the edge-emitting semiconductor structure is formed as a prismatic body with a cross section in a form of one of a polygon and a polygonal ring.

16. The optically pumped surface-emitting semiconductor laser device according to claim 1, wherein the edge-emitting semiconductor structure includes an active layer embedded between a first waveguide layer and a second waveguide layer, said first wave guide layer and said second waveguide layer being embedded between a first cladding layer and a second cladding layer.

17. The optically pumped surface-emitting semiconductor laser device according to claim 1, wherein:
the edge-emitting semiconductor structure includes a plurality of active layers that are connected in series with tunnel transitions, and
the radiation-generating quantum confinement structure includes a plurality of quantum confinement groups that respectively lie at a same height above the common substrate as an active layer of the edge-emitting semiconductor structure.

18. The optically pumped surface-emitting semiconductor laser device according to claim 1, wherein:
the radiation-emitting quantum confinement structure and the pump radiation source are arranged above one another on the common substrate; and
the radiation-emitting quantum confinement structure is optically coupled to the edge-emitting semiconductor structure, so that a pump radiation is guided into the radiation-emitting quantum confinement structure during operation of the optically pumped surface emitting semiconductor laser device.

19. The optically pumped surface-emitting semiconductor laser device according to claim 18, wherein:
the quantum confinement structure is epitaxially grown on the second waveguide layer, covers only a sub-region of the edge-emitting semiconductor structure and is optically coupled thereto, so that a part of the pump radiation generated in the edge-emitting semiconductor structure is guided into the quantum structure.

20. The optically pumped surface-emitting semiconductor laser device according to claim 19, wherein: the pump radiation source is a gain-guided radiation-emitting active region being formed in the edge-emitting semiconductor structure via a correspondingly structured current injection path on a surface of the second waveguide layer.

21. The optically pumped surface-emitting semiconductor laser device according to claim 20, wherein the pump radiation source is formed in combination with correspondingly etched trenches in the second waveguide layer.

22. The optically pumped surface-emitting semiconductor laser device according to claim 19, wherein a refractive index of the second waveguide layer is higher than a refractive index of the first waveguide layer.

23. The optically pumped surface-emitting semiconductor laser device according to claim 19, wherein the active layer is asymmetrically placed in the waveguide formed by the first waveguide layer and the second waveguide layer.

24. The optically pumped surface-emitting semiconductor laser device according to claim 2, wherein:
the common substrate is composed of a material being transmissive for a laser beam generated in the optically pumped surface emitting semiconductor laser device; and
a resonator mirror layer with an optimally substantially high reflection coefficient is applied on a side of the radiation generating quantum confinement structure facing away from the common substrate.

25. The optically pumped surface-emitting semiconductor laser device according to claim 1, wherein said radiation-generating quantum confinement structure is a radiation generating quantum well structure.

26. The optically pumped surface-emitting semiconductor laser device according to claim 1, wherein the external resonator comprises at least one external mirror.

27. The optically pumped surface-emitting semiconductor laser device according to claim 1, wherein the external resonator comprises at least one frequency elective element.

28. The optically pumped surface-emitting semiconductor laser device according to claim 1, wherein the external resonator comprises at least one frequency doubler.

29. An optically pumped surface-emitting semiconductor laser device comprising:
a radiation-generating quantum confinement structure formed by a semiconductor layer sequence, said radiation-generating quantum confinement structure being provided for generating radiation in a single resonator, said semiconductor layer sequence being epitaxially grown on a common substrate, said single resonator being an external resonator; and
a pump radiation source with a radiation region for optically pumping the radiation generating quantum confinement structure, said pump radiation source including an edge-emitting semiconductor structure in the form of a ring laser, said edge-emitting semiconductor structure being formed by the semiconductor layer sequence being epitaxially grown on the common substrate, and formed as a cylindrical body with one of a circular and annular cross section.

* * * * *

UNITED STATES PATENT AND TRADEMARK OFFICE
CERTIFICATE OF CORRECTION

PATENT NO. : 7,653,111 B2
APPLICATION NO. : 11/249094
DATED : January 26, 2010
INVENTOR(S) : Tony Albrecht et al.

Page 1 of 1

It is certified that error appears in the above-identified patent and that said Letters Patent is hereby corrected as shown below:

Title Page, Item (30) please correct the Foreign Application Priority Data of said Letters Patent as follows:

(30) Foreign Application Priority Data

May 30, 2000 (DE)    100 26 734

Feb. 20, 2001 (DE)    ~~101 18 079~~ 101 08 079

In the Claims:

Please correct Claim 27 at column 16, lines 24 to 26 of said Letters Patent as follows:

27. The optically pumped surface-emitting semiconductor laser device according to claim 1, wherein the external resonator comprises at least one frequency ~~elective~~ selective device.

Signed and Sealed this
Fourth Day of June, 2013

Teresa Stanek Rea
*Acting Director of the United States Patent and Trademark Office*